United States Patent
Li et al.

(10) Patent No.: US 12,204,995 B2
(45) Date of Patent: Jan. 21, 2025

(54) METHOD AND ARRANGEMENT FOR RESETTING QUBITS

(71) Applicant: IQM Finland Oy, Espoo (FI)

(72) Inventors: Tianyi Li, Espoo (FI); Kok Wai Chan, Espoo (FI); Kuan Yen Tan, Espoo (FI); Jan Goetz, Espoo (FI); Mikko Möttönen, Espoo (FI)

(73) Assignee: IQM FINLAND OY, Espoo (FI)

( * ) Notice: Subject to any disclaimer, the term of this patent is extended or adjusted under 35 U.S.C. 154(b) by 1045 days.

(21) Appl. No.: 17/087,901

(22) Filed: Nov. 3, 2020

(65) Prior Publication Data
US 2021/0406750 A1    Dec. 30, 2021

(30) Foreign Application Priority Data

Jun. 30, 2020  (EP) .................................... 20183079

(51) Int. Cl.
| G06N 10/40 | (2022.01) |
| H01L 33/04 | (2010.01) |
| H05K 7/20  | (2006.01) |

(52) U.S. Cl.
CPC ............. *G06N 10/40* (2022.01); *H01L 33/04* (2013.01); *H05K 7/20372* (2013.01); *H05K 7/20381* (2013.01)

(58) Field of Classification Search
None
See application file for complete search history.

(56) References Cited

U.S. PATENT DOCUMENTS

2018/0013052 A1    1/2018  Oliver et al.

FOREIGN PATENT DOCUMENTS

| CN | 108475353 A | 8/2018 |
| CN | 110476175 A | 11/2019 |
| CN | 213024477   | 4/2021 |
| EP | 3398213     | 11/2018 |
| TW | 201610726 A | 3/2016 |

(Continued)

OTHER PUBLICATIONS

Hsu, et al., Tunable Refrigerator for Non-Linear Quantum Electric Circuits, arXiv:2002.06867, Physical Review B, vol. 101, Issue 23, article id.235422, Jun. 16, 2020, pp. 1-21 (Year: 2020).*

(Continued)

*Primary Examiner* — Wilbert L Starks
(74) *Attorney, Agent, or Firm* — Meunier Carlin & Curfman LLC

(57) ABSTRACT

A method, system, and arrangement for resetting qubits are disclosed. An example system includes one or more quantum circuit refrigerators for resetting qubits. Each of the quantum circuit refrigerators includes a tunneling junction and a control input for receiving a control signal. Photon-assisted single-electron tunneling takes place across the respective tunneling junction in response to a control signal. Capacitive or inductive coupling elements between the qubits and the quantum circuit refrigerators couple each qubit to the quantum circuit refrigerator(s). The qubits, quantum circuit refrigerators, and coupling elements are located in a cryogenically cooled environment. A common control signal line to the control inputs crosses into the cryogenically cooled environment from a room temperature environment.

17 Claims, 5 Drawing Sheets

(56) References Cited

FOREIGN PATENT DOCUMENTS

| TW | 201812647 A | 4/2018 |
|---|---|---|
| TW | 201945962 A | 12/2019 |
| TW | 202011286 A | 3/2020 |
| WO | 2017115008 | 7/2017 |

OTHER PUBLICATIONS

Schuster, Circuit Quantum Electrodynamics, Doctoral Thesis, Yale University, 2007, pp. 1-255 (Year: 2007).*

Sevriuk, et al., Fast Control of Dissipation in a Superconducting Resonator, arXiv:1906.11519 [quant-ph], Jun. 27, 2019, pp. 1-4 (Year: 2019).*

Extended Search Report issued to EP20183079.1 dated Jan. 28, 2021, 10 pages.

K. Geerlings et al., "Demonstrating a Driven Reset Protocol for a Superconducting Qubit" Physical Review Letters, vol. 110, No. 12, Mar. 1, 2013.

Hao Hsu et al. "Tunable refrigerator for non-linear quantum electric circuits", ARXIV.org, Cornell University Library, 201 Olin Library Cornell University Ithaca, NY, Jun. 16, 2020.

International Search Report and Written Opinion issued to PCT/FI2021/050503, dated Oct. 20, 2021, 6 pages.

Partanen et al., "Exceptional points in tunable superconducting resonators" Physical Review, published Oct. 7, 2019, 17 pages.

Heinsoo et al., "Rapid high-fidelity multiplexed readout of superconducting qubits" Department of Physics, dated Jul. 11, 2018, 13 pages.

Office Action issued in Chinese App. No. 202010972757.2 mailed Sep. 24, 2024, 14 pages.

Office Action issued in Taiwanese App. No. 110124100 mailed Sep. 20, 2024, 18 pages.

* cited by examiner

METHOD AND ARRANGEMENT FOR RESETTING QUBITS

PRIORITY CLAIM

This application claims priority to European Patent Application No. 20183079.1, filed on Jun. 30, 2020, the entire disclosure of which is incorporated by reference herein.

TECHNICAL FIELD

The invention is generally related to quantum computing. In particular, the invention is related to resetting qubits of a quantum computing device that resides in a cryogenically cooled environment.

BACKGROUND

Superconducting chips are used in various applications such as quantum computing. Superconducting chips often include qubits, which are two-state quantum mechanical systems. Varying the states of the qubits in a controlled manner is the essence of quantum computing.

Resetting a qubit means draining excess energy from the qubit, i.e. cooling the qubit to a lowest-energy level. A method and arrangement for resetting an individual qubit are known from European Patent Publication No. EP3398213, which is incorporated herein by reference. This European patent publication describes a circuit element including a quantum circuit refrigerator (QCR). A QCR is based on a process known as photon-assisted single electron tunneling that can be made to occur in a normal-metal-insulator-superconductor (NIS) junction. Applying a suitable bias voltage to the NIS junction initiates the tunneling of individual electrons from the normal metal across the insulator to the superconductor. This single-electron tunneling requires energy, which is absorbed from the qubit in the form of a photon. Emitting the photon causes the qubit to decay to a lower energy state, which eventually results in resetting the qubit.

FIG. 1 illustrates a quantum computing system that comprises qubits located in a cryogenically cooled environment. Qubits 101, 102, and 103 are shown as examples. There may be any number of qubits. Basically, the computing power of the quantum computing system becomes greater as additional qubits are added. Input signals are injected into the qubits 101 to 103, and readout signals are obtained therefrom, by a signal processing arrangement 104 located in a surrounding room temperature environment. For resetting each qubit, there is an associated QCR, of which QCRs 105, 106, and 107 are shown as examples. The coupling between each qubit and its associated QCR may have any suitable form that enables photons emitted by the qubit to become absorbed in the associated QCR. Bias signals that activate the single-electron tunneling in the QCRs may be provided by a QCR control circuit 108, which is shown as a separate functional block in FIG. 1. In a practical implementation, the QCR control circuit 108 can be a part of the signal processing arrangement 104.

In the known arrangement of FIG. 1, the number of both qubit control lines and QCR biasing lines increases linearly in proportion to the number of qubits. The provision of signal lines between the room temperature environment and the cryogenically cooled environment may give rise to problems of increasing magnitude as the number of qubits becomes larger. Each signal line requires certain space and causes a certain heat load to the cryostat, which is used to create the cryogenically cooled environment. This manifests itself as high power consumption by thermal loading and signal dissipation in the signal path from room temperature to the cryogenic environment. Additionally, these known systems require large physical spaces, which limits the scalability of the quantum computing infrastructure. Also, increasing amounts of QCRs consume chip area, increase manufacturing cost, and cause an increasing need for cooling power for the cryostat.

SUMMARY

It is an objective to provide a method, system, and an arrangement for resetting qubits in a way that enables simpler hardware implementation at an interface between a room temperature environment and a cryogenically cooled environment. Another objective is to enable resetting qubits with a limited heat load to a cryostat. A further objective is to provide considerable freedom to the way in which the hardware interface for resetting qubits is designed.

The objectives disclosed herein are achieved by using an approach in which a common control signal affects the resetting of a plurality of qubits simultaneously, either by activating a common quantum circuit refrigerator or by simultaneously activating a number of quantum circuit refrigerator, or both.

According to a first aspect there is provided an arrangement for resetting qubits. The arrangement comprises a plurality of qubits and one or more quantum circuit refrigerators. Each quantum circuit refrigerator includes a tunneling junction and a control input for receiving a control signal. Each quantum circuit refrigerator is configured to enable photon-assisted single-electron tunneling across the respective tunneling junction in response to a control signal received through the respective control input. The arrangement also comprises coupling elements between the plurality of qubits and the one or more quantum circuit refrigerators. The coupling elements are configured to couple each of the plurality of qubits to one of the one or more quantum circuit refrigerators. The plurality of qubits, the one or more quantum circuit refrigerators, and the coupling elements are configured for operation in a cryogenically cooled environment. The arrangement may also include a common control signal line to the control inputs of the one or more quantum circuit refrigerators. The common control signal line is configured for crossing into the cryogenically cooled environment from a room temperature environment.

According to an embodiment, the coupling elements include capacitive coupling elements. This provides an advantage in that the coupling can be made through well-known means of non-galvanic coupling that are relatively easy to dimension and manufacture.

According to an embodiment, the coupling elements comprise inductive coupling elements. This provides an advantage in that the coupling can be made through well-known means of non-galvanic coupling that are relatively easy to dimension and manufacture.

According to an embodiment, the one or more quantum circuit refrigerators include a shared quantum circuit refrigerator common to at least a subset of the plurality of qubits. The arrangement further includes a resonator for coupling a tunnel junction of the shared quantum circuit refrigerator to the subset of the plurality of qubits via at least a respective subset of the coupling elements. This provides an advantage by limiting the number of needed quantum circuit refrigerators, even in systems with a relatively large number of qubits.

According to an embodiment, the resonator has a length dimensioned for a resonance frequency of an oscillating electric signal. The coupling elements of the respective subset may be located at points along the length of the resonator that correspond to a maxima of an oscillation amplitude of the oscillating electric signal at the resonance frequency. This is advantageous by providing an efficient coupling between the resonator and each of the associated qubits.

According to an embodiment, the resonance frequency is an n:th harmonic frequency of a basic resonance frequency at which the length of the resonator is one half wavelength. In an instance where the coupling elements comprise capacitive coupling elements, there may be n+1 of the points along the length of the resonator at which the coupling elements are located. Alternatively, in an instance where the coupling elements comprise inductive coupling elements, there may be n of the points along the length of the resonator at which the coupling elements are located. In this embodiment, n is a positive integer. This provides an advantage by creating a logical and/or intuitive association between the utilized resonance frequency and the number of qubits that can be reset.

According to an embodiment, the one or more quantum circuit refrigerators include as many quantum circuit refrigerators as there are qubits in the plurality of qubits. Each of the one or more quantum circuit refrigerators may be connected to a common reference potential. The common control signal line may be configured to couple the control signal to the respective control inputs of the quantum circuit refrigerators at a common potential. This is advantageous by enabling qubits of very exactly defined unique resonance frequencies to be reset. This is also advantageous by minimizing inter-qubit interference and unwanted stray coupling.

According to an embodiment, the arrangement includes a controllable demultiplexer. The common control signal line may then be configured to couple the control signal to the respective control inputs of the quantum circuit refrigerators through the controllable demultiplexer. The arrangement may also comprise a demultiplexing control signal line coupled to the controllable demultiplexer for selectively coupling the control signal to the respective control inputs of selected ones of the quantum circuit refrigerators. This provides an advantage in that a desired subset of qubits can be reset according to need.

According to an embodiment, the one or more quantum circuit refrigerators include Radio Frequency Quantum Circuit Refrigerators (RF-QCRs) that are configured to be controlled with an oscillating signal. The common control signal line may be configured for conveying the oscillating signal to the control inputs of the one or more quantum circuit refrigerators. This provides an advantage in that the operation of the quantum circuit refrigerators can be controlled by selectively injecting assisting energy to the tunneling junction.

According to an embodiment, the one or more quantum circuit refrigerators include as many RF-QCRs as there are qubits in the plurality of qubits. The arrangement may comprise an RF splitter for distributing the oscillating signal from the common control signal line into the RF-QCRs. This provides an advantage in that the number of high-frequency control lines that pass from the room temperature environment to the cryogenically cooled environment can be kept small in relation to the circuit elements that are to be controlled with high-frequency signals.

According to a second aspect, there is provided a method for resetting qubits in a cryogenically cooled environment. The method includes conducting a common control signal from a room temperature environment to the cryogenically cooled environment. The method also includes coupling the common control signal to respective control inputs of one or more quantum circuit refrigerators, thereby enabling single-electron tunneling across a tunneling junction in the one or more quantum circuit refrigerators. The method further includes using photons emitted by a plurality of qubits to drive the single-electron tunneling, thereby causing the plurality of qubits to reset.

According to an embodiment, the method includes using couplings between at least a subset of the plurality of qubits and a resonator for coupling the photons emitted by the subset of the plurality of qubits to a shared quantum circuit refrigerator. This provides an advantage in that only a limited number of quantum circuit refrigerators may be needed even in systems with a relatively large number of qubits.

According to an embodiment, the method includes using a bias voltage as the control signal. A magnitude of the bias voltage may be smaller by a first amount than a magnitude sufficient to overcome a superconducting gap of the tunneling junction. The first amount may be equal to an energy of a photon of the photons emitted by the plurality of qubits. This provides an advantage in that an exactly controlled operation of the quantum circuit refrigerators can be achieved.

According to an embodiment, the method includes using specific quantum circuit refrigerators for each of the plurality of qubits, coupling the specific quantum circuit refrigerators to a common reference potential, and coupling the control signal to the specific quantum circuit refrigerators simultaneously at a common potential. This is advantageous by enabling qubits of very exactly defined unique resonance frequencies to be reset. This is also advantageous by minimizing inter-qubit interference and unwanted stray coupling.

According to an embodiment, the method includes controllably demultiplexing the common control signal to a subset of the specific quantum circuit refrigerators. This provides an advantage in that a desired subset of qubits can be reset according to need.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 2:
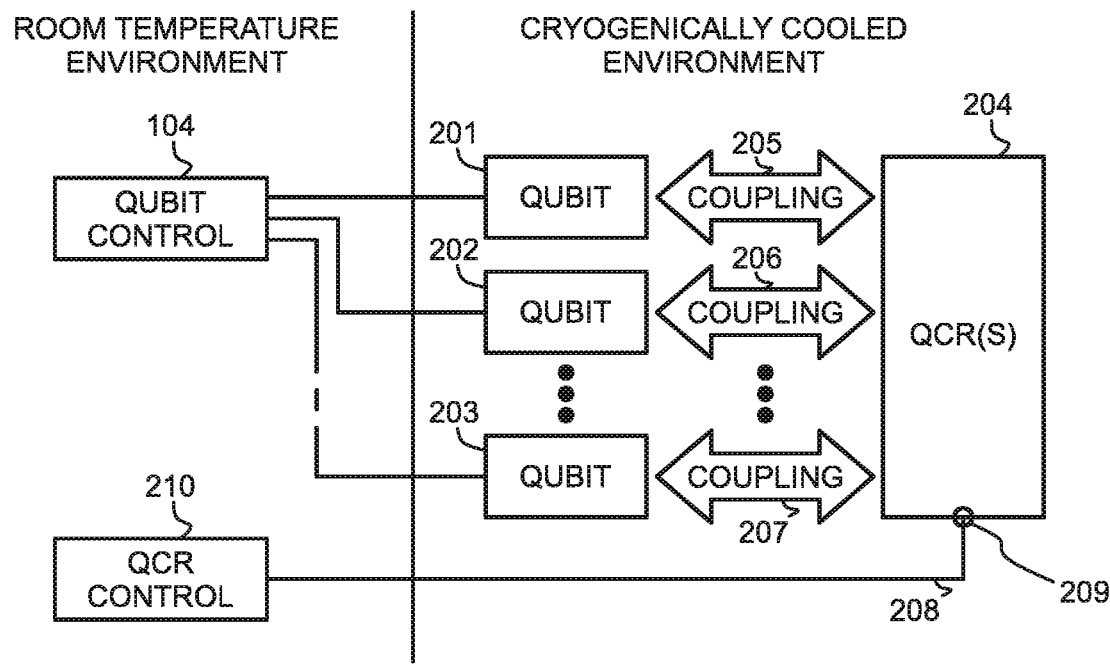
FIG. 2 illustrates an arrangement for resetting qubits according to the method, system, and arrangement disclosed herein.

FIG. 2 illustrates components of a quantum computing system. Some components of the quantum computing system reside in a cryogenically cooled environment, while other components reside in an adjacent room temperature environment. As an example, the cryogenically cooled environment may be located inside a cryostat that itself is located in the room temperature environment. The designation "room temperature" should not be taken as a limitation that would actually require the environmental conditions in the room temperature environment correspond to those in rooms where people live and work. It is more an indication that the conditions to the left in FIG. 2 do not require cryogenic cooling to the temperatures found in the cryogenically cooled environment. The environmental conditions in the cryogenically cooled environment may include an extremely low temperature, such as only a few kelvin, or even considerably less than one kelvin, such as on the order of only a few millikelvins. The lowest temperature may exist in only a part of the cryogenically cooled environment, as there may be cooled stages of progressively lower temperatures. Indicating that some component of the system is located within the cryogenically cooled environment does not limit that component to any particular stage. The environmental conditions in the cryogenically cooled environment may also include a high vacuum, which is typically needed to provide thermal insulation for maintaining the low temperatures.

The components shown in FIG. 2 relate in particular to an arrangement for resetting qubits as a part of a quantum computing system. The arrangement comprises a plurality of qubits, of which qubits 201, 202, and 203 are shown as examples in FIG. 2. A qubit control unit 104 is provided in the room temperature environment. For the purposes of this description, the nature and operation of the qubit control unit 104 is not described. The qubit control unit 104 is merely shown in FIG. 2 as a reminder that the qubits 201-203 have some purpose that is related to performing quantum computing operations.

The arrangement of FIG. 2 also comprises a QCR block 204, which includes one or more quantum circuit refrigerators (QCRs). As described herein, a quantum circuit refrigerator is a circuit element that can be designed as a standalone component. The quantum circuit refrigerator may include a tunneling junction and a control input for receiving a control signal. Such a quantum circuit refrigerator is configured to enable photon-assisted single-electron tunneling across the tunneling junction in response to a control signal received through the control input. The control signal (also referred to as a bias signal) can include a DC bias signal, a pulsed bias signal, or an AC bias signal.

In an example, the tunneling junction of a QCR has a superconducting gap on an order of 400 microelectronvolts (calculated as 96 GHz times h, where h is Boltzmann's constant). In this example, a DC bias value can be calculated as 92 GHz times h per e, where e is the electron charge. This provides a bias voltage of 383 microvolts. Applying such a bias voltage to the exemplary QCR would enable photons having a frequency of 4 GHz to make up for the difference for photon-assisted tunneling to occur. If an excited qubit was appropriately coupled to the QCR, a corresponding portion of the excitation energy may transfer from the qubit to the QCR in the form of a 4 GHz photon, consequently cooling the qubit.

As illustrated in FIG. 2, the arrangement comprises couplings 205-207 between the plurality of qubits 201-203 and the one or more quantum circuit refrigerators in the QCR block 204. The couplings 205-207 can be made, for example, through capacitive or inductive coupling elements between the plurality of qubits 201-203 and the one or more quantum circuit refrigerators. Such coupling elements are configured to couple each of the plurality of qubits 201-203 to one of the one or more quantum circuit refrigerators in the QCR block 204.

The terms capacitive coupling and capacitive coupling element cover all possible embodiments that can be used to capacitively couple two elements of a quantum circuit. Examples of capacitive coupling elements include, but are not limited to, parallel plate capacitors, finger capacitors, and lumped element circuitry. Similarly, the terms inductive coupling and inductive coupling element cover all possible embodiments that can be used to inductively couple two elements of a quantum circuit. Inductive coupling may include using e.g. SQUIDs (superconducting quantum interference devices) as the inductive coupling elements.

As shown in FIG. 2, the qubits 201-203, the quantum circuit refrigerators, and the coupling elements are configured for operation in the cryogenically cooled environment. This means in practice that these components are built as parts of one or more cryogenic integrated circuits or circuit modules, the materials of which are suitable for operation in the extremely low temperatures that prevail in the cryostat during operation. Such cryogenic integrated circuits or circuit modules are also built so that they can be attached, directly or indirectly, to the cryogenically cooled structures inside the cryostat. External connections to and from the components can be made using technologies that enable minimizing the thermal load to the cryostat.

Figure 1:
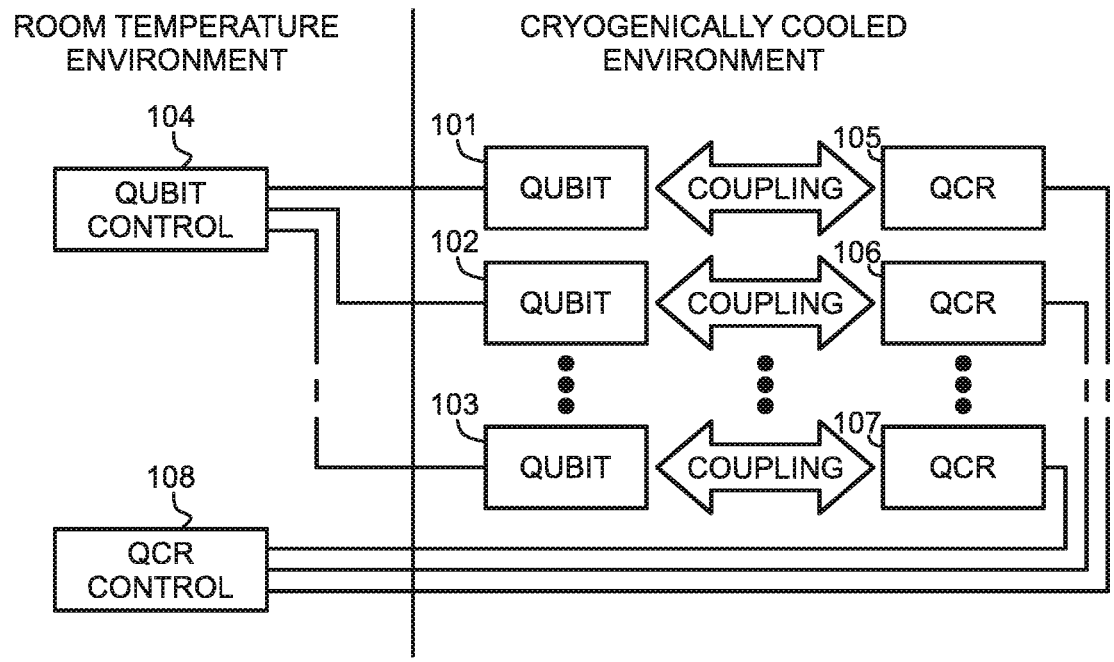
FIG. 1 illustrates a conventional, prior art arrangement for resetting qubits.

Contrary to the prior art solution shown in FIG. 1, the arrangement of FIG. 2 comprises a common control signal line 208 to the control input(s) 209 of the one or more quantum circuit refrigerators in the QCR block 204. The common control signal line 208 is configured for crossing into the cryogenically cooled environment from the room temperature environment. Concerning the hardware aspects of the arrangement, configuring a signal line for crossing into the cryogenically cooled environment from the room temperature environment means constructing the physical signal line and connectors so that the arrangement can be assembled as a part of the quantum computing system. Any necessary cold anchoring and other measures can be performed to minimize the conduction of heat into the cryostat, while simultaneously ensuring good signal propagation and protection against electromagnetic interference.

In the room temperature environment, a QCR control unit 210 may be used as a source of the control signals that are delivered to the control input(s) 209 of the one or more quantum circuit refrigerators. The QCR control unit 210 may be a standalone unit, or it may be included in the qubit control unit 104 or other larger signal processing entity within the room temperature environment.

Figure 3:
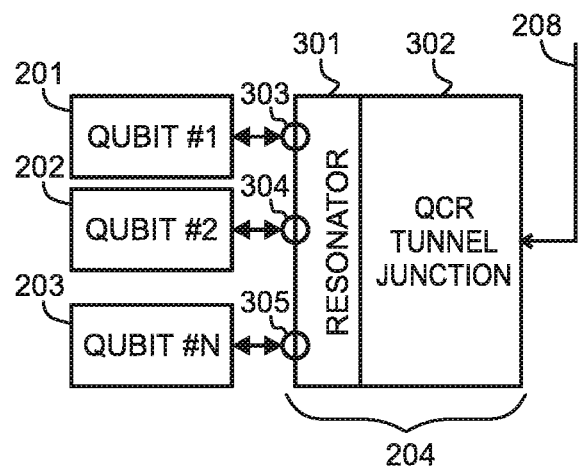
FIG. 3 illustrates a first approach to implementing the arrangement of FIG. 2.
Figure 4:
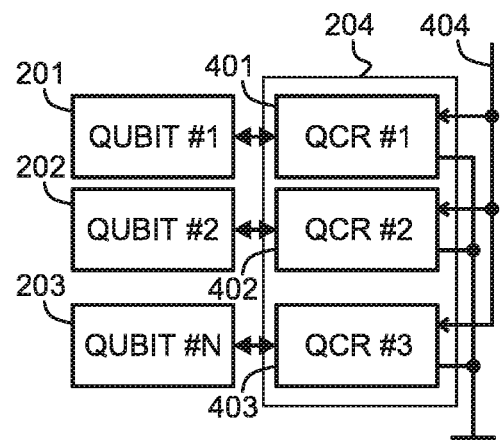
FIG. 4 illustrates a second approach to implementing the arrangement of FIG. 2.

FIGS. 3 and 4 illustrate two approaches for constructing the QCR block 204 and its couplings to the plurality of qubits. According to the approach shown in FIG. 3, in the one or more quantum circuit refrigerators of the QCR block 204, there is a shared quantum circuit refrigerator that is common to at least a subset of the plurality of qubits 201-203. The arrangement includes a resonator 301 for coupling a tunnel junction 302 of the shared quantum circuit refrigerator to the subset of the plurality of qubits 201-203 via at least a respective subset of the coupling elements mentioned above.

Figure 5:
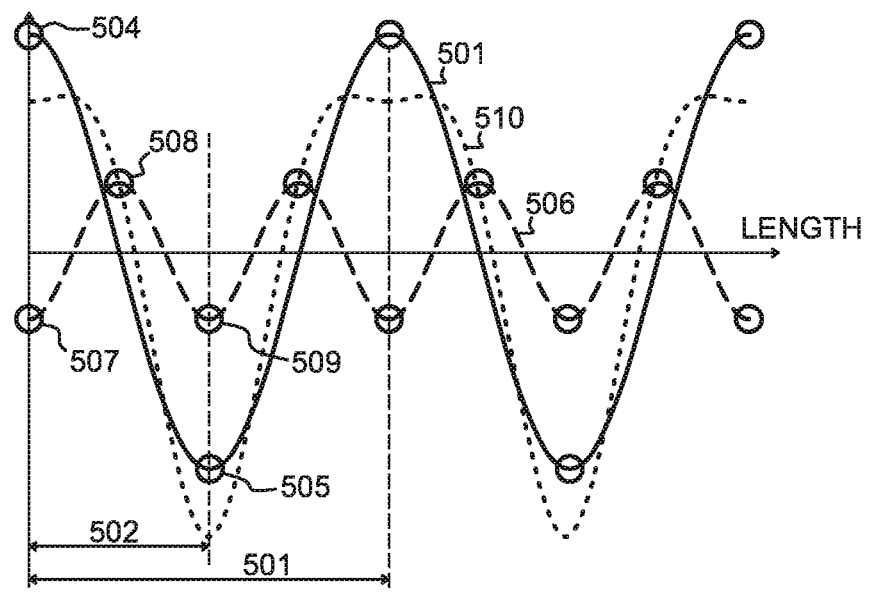
FIG. 5 illustrates the occurrence of antinodes in harmonic oscillation modes.

To make the most effective use of the coupling, it is advantageous to dimension the resonator 301 in a particular way. In general, the resonance frequencies of a resonator constitute a harmonic series, in which the resonance frequencies can be numbered as the first, second, third, etc. harmonic frequency. In some sources, the first harmonic frequency is called the base frequency, the basic resonance frequency, or the zeroth harmonic frequency. Certain properties of the harmonic frequencies and the resonator dimensioning may be considered with respect to FIG. 5. In the case of a λ/2 (lambda per two) transmission line resonator, the first harmonic frequency is the frequency at which the whole wavelength 501 of the oscillating electric signal is exactly twice the length 502 of the resonator. An example of an oscillating electric signal at the first harmonic frequency is shown with the solid line graph of FIG. 5. As shown in FIG. 5, the first harmonic frequency involves two voltage antinodes 504 and 505 along the length 502 of the λ/2 transmission line resonator.

The dashed line 506 in FIG. 5 illustrates an example of an oscillating electric signal at the second harmonic frequency. As shown in FIG. 5, the second harmonic frequency includes three voltage antinodes 507, 508, and 509 along the length 502 of the λ/2 transmission line resonator. In general, the n:th harmonic frequency (of a basic resonance frequency, at which the length of the resonator is one half wavelength) involves n+1 voltage antinodes along the length of the resonator, where n is a positive integer. The voltage antinodes may be called a maxima of an oscillation amplitude of the voltage of the oscillating electric signal. Correspondingly, there are maxima of the oscillation amplitude of the oscillating electric signal. These maxima are located at the nodes of the lines 501 and 506, i.e. at the points where the graphs intersect a horizontal axis. The dotted line 510 in FIG. 5 illustrates a combined oscillating electric signal that consists of oscillations at the first and second harmonic frequencies.

Capacitive coupling between an excited quantum circuit element (such as a qubit) and a resonator is strongest when the capacitive coupling is made at or close to an antinode of voltage oscillations along the length of the resonator. Therefore, based on this property, the resonator 301 in FIG. 3 has a length dimensioned for a resonance frequency of an oscillating electric signal. In FIG. 3, it is assumed that the capacitive coupling elements that make the capacitive couplings to the (subset of) qubits 201-203 are located at points 303, 304, and 305 along the length of the resonator, which correspond to antinodes of the oscillating electric signal at the resonance frequency.

Additionally, inductive coupling between an excited quantum circuit element (such as a qubit) and a resonator is strongest when the inductive coupling is made at or close to a node of voltage oscillations along the length of the resonator. Again, given that the resonator 301 in FIG. 3 has a length dimensioned for a resonance frequency of an oscillating electric signal, a corresponding layout could be provided in which the inductive couplings to the (subset of) qubits 201-203 are located at points along the length of the resonator that correspond to nodes of the oscillating electric signal at the resonance frequency.

The excited quantum circuit element accordingly must have a resonant frequency at the frequency at which the antinode occurs in the resonator.

As disclosed herein, the capacitive or inductive coupling elements may be located "at" points, which correspond to a maxima of an oscillation amplitude of an oscillating electric signal. In some embodiments, the capacitive or inductive coupling elements may be located "at or near" the points to have substantially the same efficiency or result. The coupling elements are placed at the antinodes or nodes to utilize the respective maximal amplitudes of voltage or current that occur. The higher the voltage or the larger the current, the better the point can be used for signal coupling. If, for example, the topology of the conductor(s) of the resonator and its relation to the location of the qubits make it impossible or disadvantageous to place a coupling element at the exact known location of an antinode or node, it can be placed so that it is at the closest possible position to the antinode or node, or at the location in which the balance between the aim mentioned above and other design considerations is the best.

FIG. 4 illustrates another approach in which the QCR block 204 includes as many quantum circuit refrigerators 401-403 as there are qubits 201-203 in the plurality of qubits. Each of the quantum circuit refrigerators 401-403 is connected to a common reference potential, which in FIG. 4 is the local ground potential. A common control signal line 404 is configured to couple a control signal to the respective control inputs of the quantum circuit refrigerators 401-403 at a common potential. Given the numerical example discussed above, the common potential of the control signal may be, for example, some hundreds of microvolts or some millivolts with respect to the common reference potential.

Figure 6:
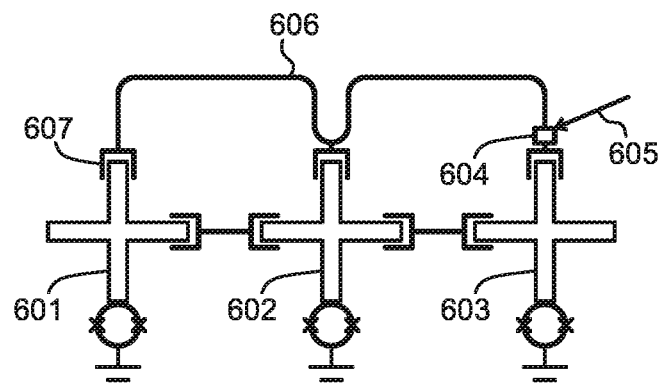
FIGS. 6 to 10 illustrate parts of a quantum computing circuit.

FIG. 6 illustrates a portion of a quantum computing circuit that uses the arrangement for resetting qubits according to the approach discussed in connection with FIG. 3. Three qubits 601, 602, and 603 and one quantum circuit refrigerator 604 are shown as an example. The qubits 601-603 may constitute a subset of all qubits in a larger quantum computing system. Capacitive couplings to the qubits 601, 602, and 603 is used here as an example, but inductive coupling could be used as well.

As shown in FIG. 6, a quantum circuit refrigerator 604 includes a control input 605. As explained above, the quantum circuit refrigerator 604 includes a tunneling junction (not separately shown in FIG. 6), and is configured to enable photon-assisted single-electron tunneling across the tunneling junction in response to a control signal received through the control input 605. As the same quantum circuit refrigerator 604 can have a cooling effect on all three qubits 601-603, the control signal line that is coupled to its control input 605 of the quantum circuit refrigerator 604 may be referred to as a common control signal line. Similarly, the quantum circuit refrigerator 604 may be referred to as a shared quantum circuit refrigerator that is common to the plurality of qubits 601-603.

The arrangement shown in FIG. 6 includes a resonator 606 for coupling the shared quantum circuit refrigerator 604 to the qubits 601-603. The coupling is provided via a set of capacitive coupling elements, of which the capacitive coupling element 607 is shown as an example. The resonator 606 has a length that is dimensioned for a resonance frequency of an oscillating electric signal. The capacitive coupling elements 607 are located at points along the length of the resonator 606 that correspond to voltage antinodes of the oscillating electric signal at its resonance frequency. Comparing to the lines in FIG. 5, it may be assumed that the resonator 606 is dimensioned for a basic resonance frequency at which its length is one half wavelength. The second harmonic frequency, which is twice the basic resonance frequency, involves three voltage antinodes along that length, of which two are at the ends of the resonator 606 and the third is at the middle.

Figure 7:
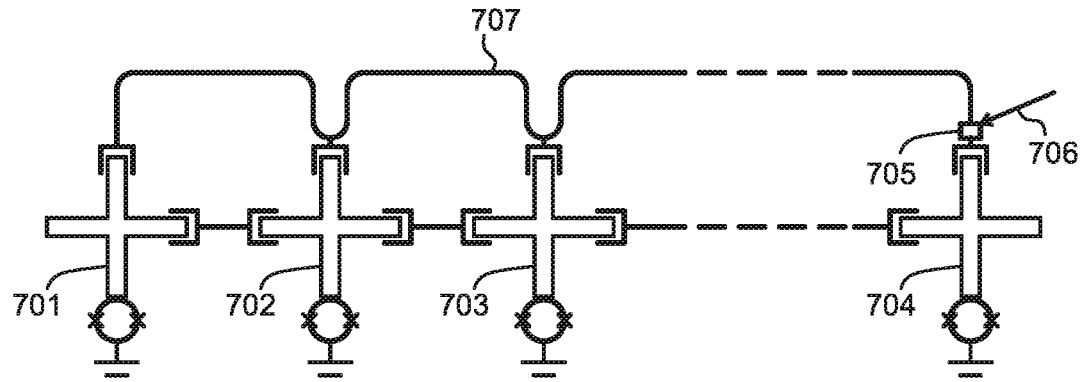

FIG. 7 illustrates a portion of a quantum computing system and an arrangement for resetting qubits. In this example, the principle explained above with reference to FIGS. 3 and 6 is generalized as an arbitrary number of qubits. Qubits 701, 702, 703, and 704 may constitute a subset of all qubits in the quantum computing system. Alternatively, qubits 701, 702, 703, and 704 may comprise all of the qubits in the quantum computing system. In other words, the subset does not need to be a proper subset but as an extreme case it may be the whole set. Similar to FIG. 6, the quantum computing system shown in FIG. 7 uses capacitive coupling as an example. In the alternative, inductive coupling could be used.

The plurality of qubits 701-704 share a common quantum circuit refrigerator 705. A control input of the quantum circuit refrigerator 705 is shown as control input 706. The arrangement includes a resonator 707 for coupling the shared quantum circuit refrigerator 705 to the plurality of qubits 701-704 via a respective subset of capacitive coupling elements. The resonator 707 has a length dimensioned for a resonance frequency of an oscillating signal. Additionally, the capacitive coupling elements are located at points along the length of the resonator 707 that corresponds to antinodes of an oscillating electric signal at a resonance frequency. The resonance frequency may be an n:th harmonic frequency of a basic resonance frequency at which the length of the resonator 707 is one half wavelength. In other words, the magnitude of the resonance frequency may be n times the basic resonance frequency. There are n+1 qubits in the arrangement, and n+1 points along the resonator 707 at which the capacitive coupling elements are located. In the example, n may be a positive integer.

Figure 8:
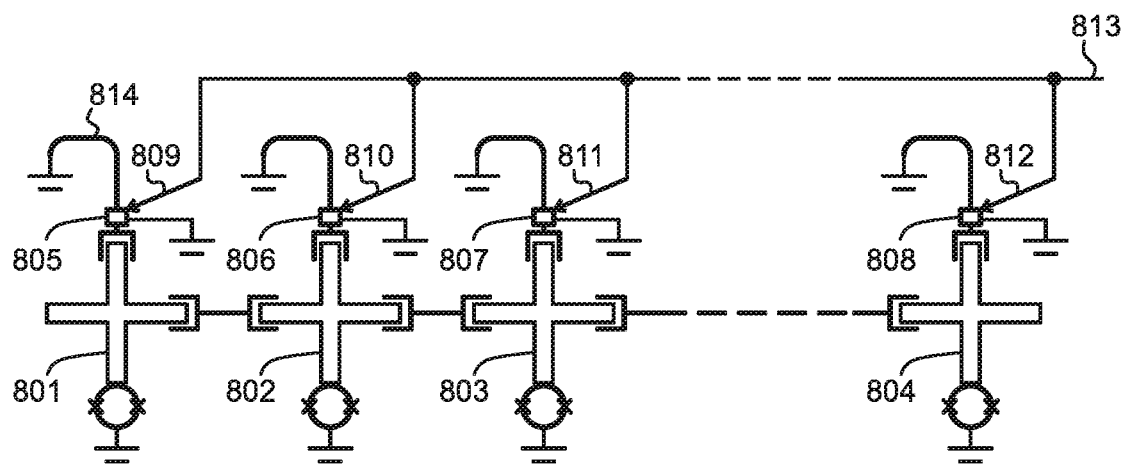
Figure 9:
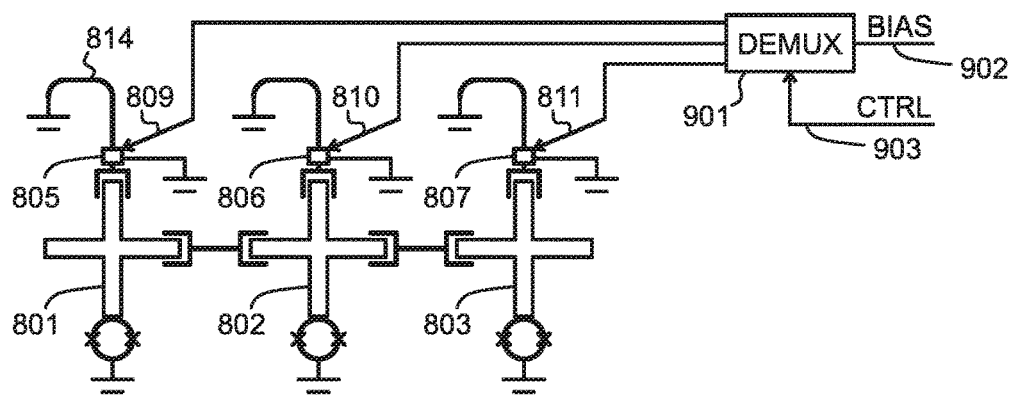
Figure 10:
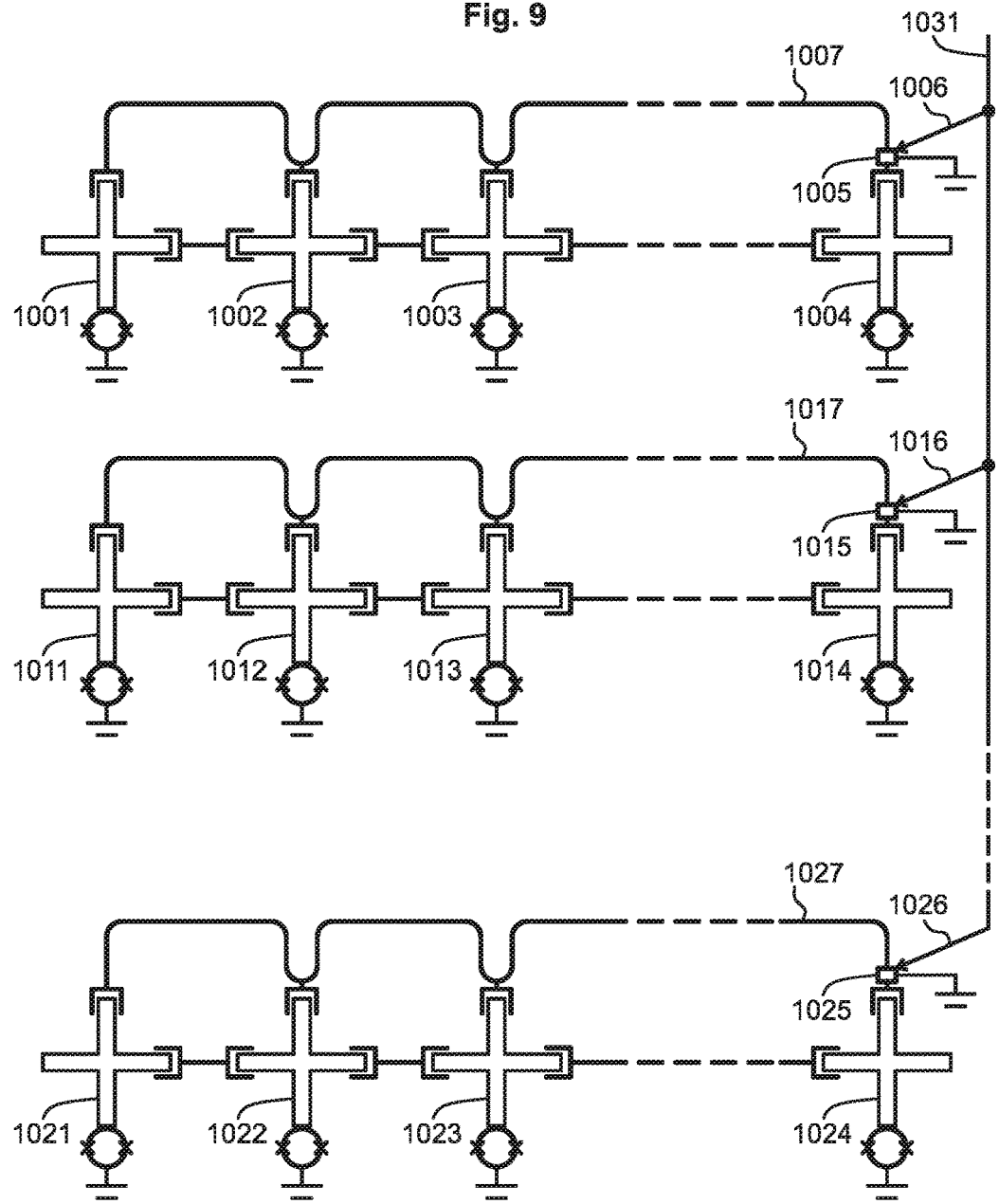

To maintain easy comparison between illustrated embodiments, the capacitive coupling is used as an example also in FIGS. 8, 9, and 10. It should be noted, however, that inductive coupling could be used instead.

FIG. 8 illustrates a portion of a quantum computing circuit that uses an arrangement for resetting qubits according to the approach described in connection with FIG. 4. Qubits 801, 802, 803, and 804 are shown as an example. The qubits 801-804 may constitute a subset of all qubits in a larger quantum computing system or they may constitute all the qubits in the quantum computing system (in other words, the subset does not need to be a proper subset but as an extreme case it may be the whole set).

The arrangement of FIG. 8 includes as many quantum circuit refrigerators 805, 806, 807, and 808 as there are qubits in the arrangement. Each quantum circuit refrigerator 805-808 is connected to a common reference potential, which includes a local ground potential. Control inputs of the quantum circuit refrigerators 805-808 are shown as control inputs 809, 810, 811, and 812. A common control signal line 813 is configured to couple a control signal to the respective control inputs 809-812 of the quantum circuit refrigerators 805-808 at a common potential. This disclosed configuration minimizes impedance differences in the connections between the common control signal line 813 and each of the control inputs 809-812 of the quantum circuit refrigerators 805-808, which could cause a potential difference between the common control signal line 813 and any of the control inputs 809-812.

In the embodiments of FIGS. 6 and 7, the qubits 601-603 or 701-704 of the arrangement should share at least one common resonance frequency, which is the frequency at which the voltage antinodes occur in the resonator 606 or 707 at those points where the capacitive couplings to the qubits are located. In a typical quantum computing system, the qubits comprise some frequency tunability, so the required condition of at least one common resonance frequency of suitable magnitude can be achieved by frequency tuning the qubits appropriately for the duration of time when they are to be reset.

In the embodiment of FIG. 8, each of the quantum circuit refrigerators 805-808 is coupled to a specific resonator, of which the leftmost resonator 814 is shown as an example. In such a case, each qubit-resonator-pair must have a common resonance frequency of the qubit and the resonator to enable the emission of photons from the qubit to the quantum circuit refrigerator for the purpose of photon-assisted single-electron tunneling. This can be achieved by suitable dimensioning of the qubits and the respective resonators. As the common control signal appears in each of the quantum circuit refrigerators 805-808 on the same potential with respect to the common reference potential, the superconductive gaps in the respective tunneling junctions are selected so that in each case, an external control signal of just that magnitude summed with the energy of a photon at the resonance frequency enables single-electron tunneling. This too can be achieved by suitable dimensioning.

FIG. 9 illustrates a portion of a quantum computing circuit that uses an arrangement for resetting qubits according to the approach described in connection with FIG. 4, with certain additions described below. Qubits 801-803, qubit-specific quantum circuit refrigerators 805-807, respective control inputs 809-811, and QCR-specific resonators (e.g., resonator 814) are similar to the corresponding components in FIG. 8. The arrangement of FIG. 9 includes a controllable demultiplexer 901, which is a device that controllably distributes a common input signal into a selected subset of its outputs or to all outputs. The controllable demultiplexer 901 is located in the cryogenically cooled environment. A common control signal line 902 is configured to couple the control signal to the respective control inputs 809-811 of the quantum circuit refrigerators 805-807 through the controllable demultiplexer 901. A demultiplexing control signal line 903 is provided and coupled to the controllable demultiplexer for selectively coupling the control signal to the respective control inputs of the selected quantum circuit refrigerators.

The use of a controllable demultiplexer, as shown in FIG. 9, enables an operator to select whether all of the plurality of qubits or only a subset of the qubits should be reset at any one time. A selection made by the operator is transmitted as a selection command to the controllable demultiplexer 901 through the demultiplexing control signal line 903, which may originate from the room temperature environment and propagate to the cryogenically cooled environment in a similar way as the common control lines 208, 404, 813, or 902 described above.

FIG. 10 illustrates a portion of a quantum computing circuit that uses an arrangement for resetting qubits that combines the approaches described in connection with FIGS. 3 and 4. Each horizontal line of qubits has a shared quantum circuit refrigerator that is common to all of the coupled qubits (e.g., qubits 1001, 1002, 1003, and 1004 and their shared quantum circuit refrigerator 1005). Each horizontal line also includes a resonator for coupling the shared quantum circuit refrigerator to the qubits on that horizontal line via a respective set of capacitive coupling elements (e.g., resonator 1007). The resonator has a length that is dimensioned for a resonance frequency of an oscillating signal. The capacitive coupling elements are located at points along the resonator's length that correspond to voltage antinodes of an oscillating electric signal at a resonance frequency.

The arrangement of FIG. 10 includes as many quantum circuit refrigerators as there are horizontal lines (or, more generally, subsets of qubits) (including quantum circuit refrigerators 1005, 1015, and 1025). Each of these quantum circuit refrigerators is connected to a common reference potential. A common control signal line 1031 is configured to couple a control signal to the respective control inputs 1006, 1016, and 1026 of the quantum circuit refrigerators 1005, 1015 and 1025 at a common potential.

In some embodiments, the resonators 1007, 1017, and 1027 may be dimensioned for different basic resonance frequencies, and/or there may be different numbers of voltage antinode points along their lengths. This provides more flexibility regarding the resonance frequencies to which the different subsets of qubits 1001-1004, 1011-1014, and 1021-1024 need to be tuned for resetting.

A controllable demultiplexer, such as the demultiplexer 901 of FIG. 9 could be added between the common control signal line 1031 and at least a subset of the quantum circuit refrigerators 1005, 1015 and 1025 of FIG. 10. This would enable an operator to select a desired number of horizontal qubit lines for resetting at any one time.

In the above description, the common control signal to the one or more quantum circuit refrigerators is generally assumed to carry a DC or quasi-DC control signal. As an alternative, the RF-QCRs can be used, which are controlled with an oscillating control signal having a high frequency. The control signal may also be a combination of a DC (or quasi-DC) signal and an oscillating signal superposed thereupon.

The use of a high-frequency control signal to control one or more QCRs is based on using the control signal to inject "assisting" energy to the QCR tunneling junction. When executed properly, the amount of injected RF energy can be made to correlate with the number of photons that the electrons absorb in order to tunnel across the junction, which in turn means more effective cooling of the quantum circuit element to be cooled.

Figure 11:
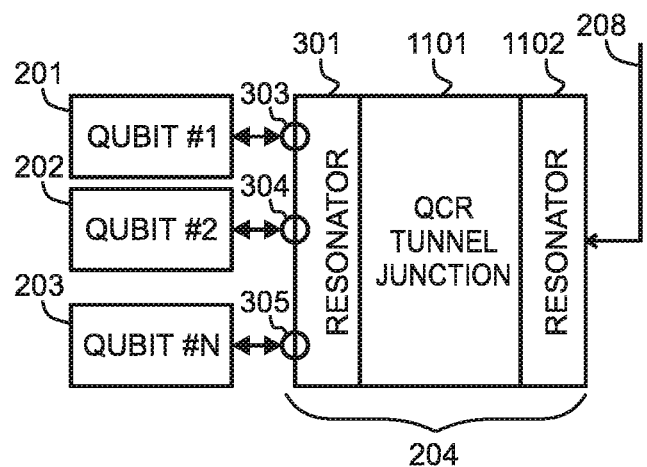
FIG. 11 illustrates the use of an RF-QCR in the approach of FIG. 3.

FIG. 11 illustrates schematically the use of an RF-QCR as the shared quantum circuit refrigerator 204 in conformity with the approach described above in connection with FIG. 3. The high-frequency control signal is brought through a common control signal line 208 to the RF-QCR 204, where it may be coupled to a tunnel junction 1101 of the shared quantum circuit refrigerator through a resonator 1102, for example. The resonator 1102 is not mandatory, and the high-frequency control signal could instead be coupled directly to the tunnel junction 1101 of the shared quantum circuit refrigerator. The frequency of the high-frequency control signal may be significantly higher than the resonance frequency of the resonator 301 in the RF-QCR. For example, the control signal may be twice or three times the resonance frequency of the resonator 301 in the RF-QCR.

Figure 12:
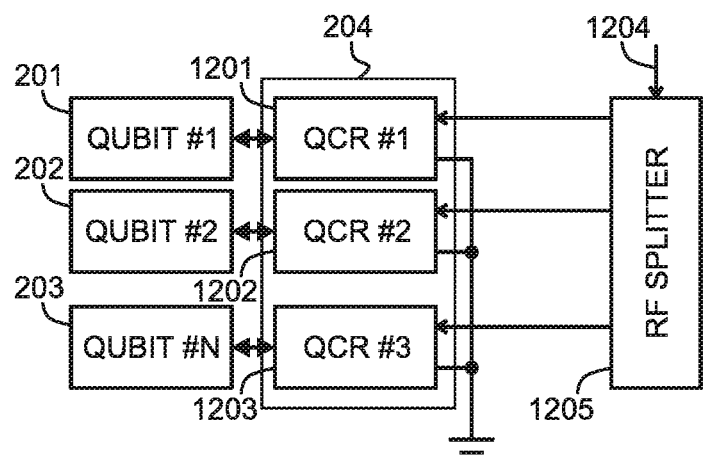
FIG. 12 illustrates the use of RF-QCRs in the approach of FIG. 4.

FIG. 12 illustrates schematically the use of a plurality of RF-QCRs 1201, 1202, and 1203 in conformity with the approach described above in connection with FIG. 4. The high-frequency control signal is brought through a common control signal line 1204 to an RF splitter 1205, from which it is provided to a plurality of RF-QCRs 1201, 1202, and 1203. In this case, the RF splitter 1205 may include, for example, a transmission line. The frequency of the high-frequency control signal brought to the transmission line may be a multiple of the resonant frequencies of the QCR resonators in the RF-QCRs 1201, 1202, and 1203.

It is obvious to a person skilled in the art that with the advancement of technology, the invention disclosed herein may be implemented in various ways. The invention and its embodiments are thus not limited to the examples described above, and instead may vary within the scope of the claims.

The invention claimed is:

1. A system for resetting qubits comprising:
a plurality of qubits;
one or more quantum circuit refrigerators, each of the one or more quantum circuit refrigerators including a tunneling junction and a control input for receiving a control signal, and each of the one or more quantum circuit refrigerators configured to enable photon-assisted single-electron tunneling across the respective tunneling junction in response to a control signal received through the respective control input;
coupling elements located between the plurality of qubits and the one or more quantum circuit refrigerators, the coupling elements configured to couple each of the plurality of qubits to one of the one or more quantum circuit refrigerators; and
a common control signal line to the control inputs of the one or more quantum circuit refrigerators,
wherein the plurality of qubits, the one or more quantum circuit refrigerators, and the coupling elements are configured for operation in a cryogenically cooled environment, and
wherein the common control signal line is configured for crossing into the cryogenically cooled environment from a room temperature environment.

2. The system according to claim 1, wherein the coupling elements include capacitive coupling elements.

3. The system according to claim 1, wherein the coupling elements include inductive coupling elements.

4. The system according to claim 1, wherein the one or more quantum circuit refrigerators include a shared quantum circuit refrigerator that is common to at least a subset of the plurality of qubits.

5. The system according to claim 4, further comprising a resonator configured to couple a tunnel junction of the shared quantum circuit refrigerator to the subset of the plurality of qubits via at least a respective subset of the coupling elements.

6. The system according to claim 5, wherein the resonator has a length that is dimensioned for a resonance frequency of an oscillating electric signal, and
wherein the coupling elements of the respective subset are located at points along the length of the resonator that correspond to a maxima of an oscillation amplitude of the oscillating electric signal at the resonance frequency.

7. The system according to claim 6, wherein the resonance frequency is an n:th harmonic frequency of a basic resonance frequency at which the length of the resonator is one half wavelength, and
wherein there are n+1 of the points along the length of the resonator at which the coupling elements are located when the coupling elements include capacitive coupling elements or there are n of the points along the length of the resonator at which the coupling elements are located when the coupling elements include inductive coupling elements.

8. The system according to claim 7, wherein n is a positive integer.

9. The system according to claim 1, wherein the one or more quantum circuit refrigerators include as many quantum circuit refrigerators as there are qubits in the plurality of qubits,
  wherein each of the one or more quantum circuit refrigerators is connected to a common reference potential, and
  wherein the common control signal line is configured to couple the control signal to the respective control inputs of the quantum circuit refrigerators at a common potential.

10. The system according to claim 9, further comprising:
a controllable demultiplexer; and
a demultiplexing control signal line coupled to the controllable demultiplexer,
  wherein the common control signal line is configured to couple the control signal to the respective control inputs of the quantum circuit refrigerators through the controllable demultiplexer, and
  wherein the demultiplexing control signal line is coupled to the controllable demultiplexer for selectively coupling the control signal to the respective control inputs of selected ones of the quantum circuit refrigerators.

11. The system according to claim 1, wherein the one or more quantum circuit refrigerators are Radio Frequency Quantum Circuit Refrigerators (RF-QCRs) configured to be controlled with an oscillating signal, and
  wherein the common control signal line is configured for conveying the oscillating signal to the control inputs of the one or more quantum circuit refrigerators.

12. The system according to claim 11, further comprising an RF splitter,
  wherein the one or more quantum circuit refrigerators include as many RF-QCRs as there are qubits in the plurality of qubits, and
  wherein the RF splitter is configured to distribute the oscillating signal from the common control signal line into the RF-QCRs.

13. A method for resetting qubits in a cryogenically cooled environment, the method comprising:
  conducting a common control signal from a room temperature environment to the cryogenically cooled environment;
  coupling the common control signal to respective control inputs of one or more quantum circuit refrigerators, enabling single-electron tunneling across a tunneling junction in the one or more quantum circuit refrigerators; and
  using photons emitted by a plurality of qubits to drive the single-electron tunneling, causing the plurality of qubits to reset.

14. The method according to claim 13, further comprising using couplings between a least a subset of the plurality of qubits and a resonator for coupling the photons emitted by the subset of the plurality of qubits to a shared quantum circuit refrigerator.

15. The method according to claim 13, further comprising using a bias voltage as the common control signal,
  wherein a magnitude of the bias voltage is smaller by a first amount than a magnitude sufficient to overcome a superconducting gap of the tunneling junction, and
  wherein the first amount is equal to an energy of a photon of the photons emitted by the plurality of qubits.

16. The method according to claim 13, further comprising:
  using specific quantum circuit refrigerators for each of the plurality of qubits;
  coupling the specific quantum circuit refrigerators to a common reference potential; and
  coupling the common control signal to the specific quantum circuit refrigerators simultaneously at a common potential.

17. The method according to claim 16, further comprising controllably demultiplexing the common control signal to a subset of the specific quantum circuit refrigerators.

* * * * *